(12) United States Patent
Von Waechter et al.

(10) Patent No.: US 10,332,814 B2
(45) Date of Patent: Jun. 25, 2019

(54) BONDED SYSTEM AND A METHOD FOR ADHESIVELY BONDING A HYGROSCOPIC MATERIAL

(71) Applicant: Infineon Technologies AG, Neubiberg (DE)

(72) Inventors: Claus Von Waechter, Sinzing (DE); Christian Altschaeffl, Vilsheim (DE); Holger Doepke, Sinzing (DE); Uwe Hoeckele, Regensburg (DE); Franz Xaver Muehlbauer, Rimbach (DE); Daniel Porwol, Straubing (DE); Tobias Schmidt, Regenstauf (DE); Christian Schweiger, Pentling (DE); Carsten Von Koblinski, Villach (AT)

(73) Assignee: Infineon Technologies AG, Neubiberg (DE)

( * ) Notice: Subject to any disclaimer, the term of this patent is extended or adjusted under 35 U.S.C. 154(b) by 2 days.

(21) Appl. No.: 15/047,098

(22) Filed: Feb. 18, 2016

(65) Prior Publication Data

US 2016/0247739 A1  Aug. 25, 2016

(30) Foreign Application Priority Data

Feb. 23, 2015  (DE) .................. 10 2015 102 535

(51) Int. Cl.
*H01L 23/26*  (2006.01)
*H01L 23/00*  (2006.01)
*H01L 23/31*  (2006.01)

(52) U.S. Cl.
CPC .......... *H01L 23/26* (2013.01); *H01L 23/564* (2013.01); *H01L 24/96* (2013.01); *H01L 24/97* (2013.01); *H01L 23/3135* (2013.01); *H01L 2224/04105* (2013.01); *H01L 2224/12105* (2013.01); *H01L 2924/3025* (2013.01)

(58) Field of Classification Search
CPC ... H01L 23/26; H01L 23/291; H01L 23/3135; H01L 21/02266; H01L 21/02271; H01L 23/564; H01L 21/02312
See application file for complete search history.

(56) References Cited

U.S. PATENT DOCUMENTS

| | | | |
|---|---|---|---|
| 5,793,118 A | 8/1998 | Nakajima | |
| 5,866,952 A * | 2/1999 | Wojnarowski | ........ H01L 21/568 257/687 |
| 6,214,702 B1 * | 4/2001 | Kim | ........ H01L 21/2007 257/640 |
| 9,627,338 B2 | 4/2017 | Chian et al. | |
| 2002/0187590 A1 | 12/2002 | Bolken et al. | |
| 2004/0155352 A1 | 8/2004 | Ma | |

(Continued)

FOREIGN PATENT DOCUMENTS

CN   104037138   9/2014

*Primary Examiner* — Ahmed N Sefer
(74) *Attorney, Agent, or Firm* — Dicke, Billig & Czaja, PLLC

(57) ABSTRACT

A bonded system includes a reconstituted wafer including a hygroscopic material. A moisture barrier layer is arranged over a surface of the reconstituted wafer. An adhesive layer is arranged over a surface of the moisture barrier opposite the reconstituted wafer. A carrier is arranged over a surface of the adhesive layer opposite the moisture barrier. The adhesive layer adhesively bonds the reconstituted wafer and the carrier together.

18 Claims, 7 Drawing Sheets

(56) References Cited

U.S. PATENT DOCUMENTS

| | | | |
|---|---|---|---|
| 2005/0082681 A1 | 4/2005 | Wijdenes | |
| 2008/0296751 A1 | 12/2008 | Fan | |
| 2009/0081830 A1 | 3/2009 | Omandam et al. | |
| 2010/0007007 A1 | 1/2010 | Yoon et al. | |
| 2010/0078812 A1 | 4/2010 | Chen | |
| 2010/0164083 A1 | 7/2010 | Yim | |
| 2010/0203682 A1 | 8/2010 | Kikuchi et al. | |
| 2011/0156240 A1* | 6/2011 | Luan | H01L 21/561 257/692 |
| 2011/0298110 A1 | 12/2011 | Pagaila | |
| 2012/0146231 A1 | 6/2012 | Meyer et al. | |
| 2012/0168942 A1 | 7/2012 | Gan et al. | |
| 2012/0256315 A1* | 10/2012 | Meyer | H01L 21/561 257/738 |
| 2012/0292728 A1 | 11/2012 | Tsai et al. | |
| 2013/0040423 A1* | 2/2013 | Tung | H01L 23/3114 438/107 |
| 2013/0168858 A1* | 7/2013 | Ramasamy | H01L 24/96 257/738 |
| 2013/0214430 A1 | 8/2013 | Pagaila | |
| 2013/0236710 A1* | 9/2013 | Honda | C23C 16/483 428/212 |
| 2013/0241077 A1* | 9/2013 | Fuergut | H01L 23/492 257/774 |
| 2013/0292684 A1* | 11/2013 | Nikitin | H01L 24/03 257/76 |
| 2013/0341784 A1 | 12/2013 | Lin et al. | |
| 2014/0001615 A1* | 1/2014 | Otremba | H01L 23/3107 257/676 |
| 2014/0008809 A1* | 1/2014 | Scanlan | H01L 21/561 257/773 |
| 2014/0061878 A1* | 3/2014 | Mahler | H01L 24/96 257/666 |
| 2014/0091455 A1* | 4/2014 | Strothmann | H01L 23/3114 257/734 |
| 2014/0103509 A1 | 4/2014 | Yoon et al. | |
| 2014/0117531 A1 | 5/2014 | Mahler et al. | |
| 2014/0183761 A1 | 7/2014 | Lin et al. | |
| 2014/0242736 A1* | 8/2014 | Dickey | H01L 23/291 438/26 |
| 2014/0252641 A1* | 9/2014 | Lim | H01L 21/56 257/773 |
| 2014/0264808 A1 | 9/2014 | Wolter et al. | |
| 2015/0348936 A1* | 12/2015 | Lin | H01L 23/552 257/659 |
| 2016/0104666 A1* | 4/2016 | Gowda | H01L 23/3164 257/774 |

\* cited by examiner

BONDED SYSTEM AND A METHOD FOR ADHESIVELY BONDING A HYGROSCOPIC MATERIAL

CROSS-REFERENCE TO RELATED APPLICATION

This Utility Patent Application claims priority to German Patent Application No. 10 2015 102 535.3, filed Feb. 23, 2015; and which is incorporated herein by reference.

BACKGROUND

The present disclosure relates to a bonded system including a reconstituted wafer and a carrier. The present disclosure further relates to a method for bonding a reconstituted wafer to a carrier and to a method for adhesively bonding a hygroscopic material to a substrate.

A hygroscopic material absorbs moisture or humidity. The moisture may be taken from the surrounding atmosphere. When heating a hygroscopic material the absorbed moisture may be at least partly released. During a vacuum process absorbed moisture may also be at least partly released from a hygroscopic material. An adhesive bond between a substrate or a carrier and a hygroscopic material may be degraded by the moisture coming out of the hygroscopic material with changing temperatures or under vacuum. An adhesive layer applied to a hygroscopic material may e.g., delaminate. During an adhesive process the required adhesive force may not be established due to the moisture coming out of the hygroscopic material.

For this and other reasons there is a need for the present invention.

BRIEF DESCRIPTION OF THE DRAWINGS

The accompanying drawings are included to provide a further understanding of examples and are incorporated in and constitute a part of the description. The drawings illustrate examples and together with the description serve to explain principles of examples. Other examples and many of the intended advantages of examples will be readily appreciated as they become better understood by reference to the following detailed description.

DETAILED DESCRIPTION

Figure 1:
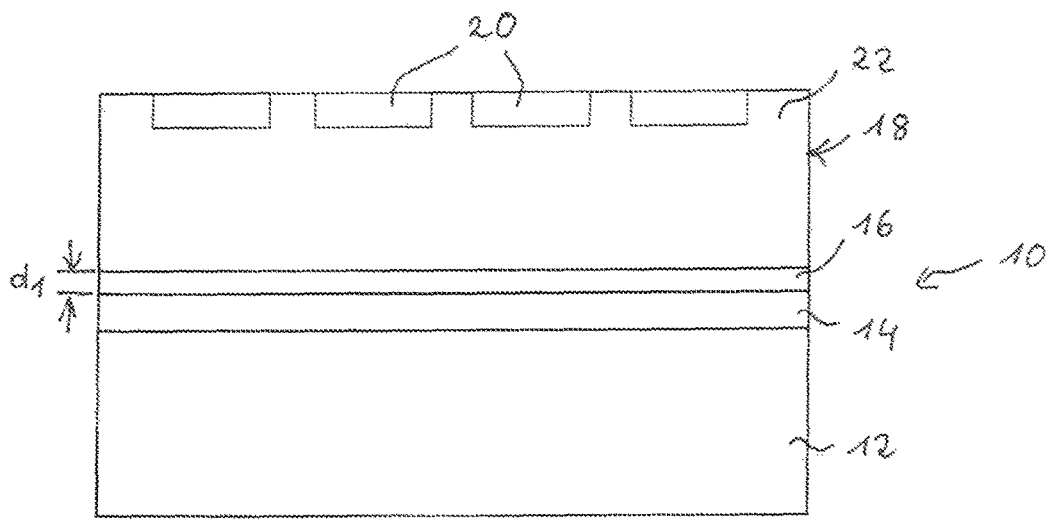
FIG. 1 schematically illustrates a first example of a bonded system.

In the following detailed description reference is made to the accompanying drawings which illustrate specific aspects in which the disclosure may be practiced. In this regard, directional terminology, such as "top", "bottom", "front", "back", "upper", etc. may be used with reference to the orientation of the figures being described. The directional terminology is used for purposes of illustration and is in no way limiting.

The various aspects summarized may be embodied in various forms. The following description shows by way of illustration various combinations and configurations in which the aspects may be practiced. It is understood that the described aspects and/or examples are merely examples and that other aspects and/or examples may be utilized and structural and functional modifications may be made without departing from the concept of the present disclosure. The following detailed description is therefore not to be taken in a limiting sense, and the concept of the present disclosure is defined by the appended claims. In addition, while a particular feature or aspect of an example may be disclosed with respect to only one of several implementations, such feature aspects may be combined with one or more other features or aspects of the other implementations as it may be desired and advantages for any given or particular application.

It is to be appreciated that features and/or elements and/or layers depicted herein may be illustrated with particular dimensions relative to each other for purposes of simplicity and ease for understanding. Actual dimensions of the features and/or elements and/or layers may differ from that illustrated herein.

To the extent that the terms "include", "have", "with" or other variants thereof are used in either the detailed description or the claims, such terms are intended to be inclusive in a manner similar to the term "comprise". Also the term "exemplary" is merely meant as "an example", rather than as "best" or "optimal".

Further, the word "over" used with regard to e.g., a material layer formed or located "over" a surface of an object may be used herein to mean that the material layer may be located (e.g., formed, deposited, etc.) "directly on", e.g., in direct contact with, the implied surface. The word "over" used with regard to e.g., a material layer formed or located "over" a surface may also be used herein to mean that the material layer may be located (e.g., formed, deposited, etc.) "indirectly on" the implied surface with e.g., one or more additional layers being arranged between the implied surface and the material layer.

A reconstituted wafer in accordance with the disclosure may include a plurality of two or more semiconductor chips. In a reconstituted wafer, singulated semiconductor chips may be embedded in a mold compound. An example of a reconstituted wafer is an embedded wafer level ball grid array (eWLB). A reconstituted wafer may include semiconductor chips which may be similar to each other or which differ from each other. Two or more semiconductor chips in a reconstituted wafer may be combined later on in the same semiconductor device.

In one example, a reconstituted wafer may be of circular form or shape. In a further example, a reconstituted wafer may have a rectangular form. Generally spoken, a reconstituted wafer may be of any suitable or arbitrary form. A reconstituted wafer may particularly allow the performance of processing steps in parallel. Afterwards, the reconstituted wafer may be finally separated into distinct electronic components.

In one example, a mold compound included in a reconstituted wafer may include a hygroscopic material. In addition or alternatively, a mold compound may include an epoxy material.

A moisture barrier layer may relate to a layer that may hinder or completely inhibit penetration of moisture. Penetration of moisture through the barrier layer may be at least retarded. Depending on a material used for manufacturing a moisture barrier layer, possible thicknesses of the moisture barrier layer may differ. The thickness may depend on the moisture penetration characteristics of the material used. The easier moisture can penetrate the barrier layer material, the thicker the barrier layer may be made. The slower moisture can penetrate the barrier layer material, the thinner the barrier layer may be made. In one example, a moisture barrier layer may be (or may include at least one of) an oxide layer, a nitride layer, a carbide layer. In a further example, a moisture barrier layer may additionally or alternatively include a metal layer. Other materials may also be used for manufacturing moisture barriers. A thickness of a moisture barrier layer may lie in a range from about 200 nm to about 3 μm (micrometer). A thickness of the barrier layer may also depend on a surface roughness of a hygroscopic material onto which the barrier layer may be arranged. In general, a rougher surface may result in a choice of a thicker barrier layer.

An adhesive for forming an adhesive layer in accordance with the disclosure may be a temporary adhesive or a permanent adhesive. The term "temporary adhesive" as used herein may refer to an adhesive which may be intended to temporarily bond two components together. Two different mechanisms may be used for temporary adhesives. Either the temporary adhesive may have a low adhesive force which allows an easy mechanical de-bonding, or the temporary adhesive may allow for controlled destruction of the adhesive force. Both mechanisms may also be combined.

The term "permanent adhesive" as used herein may refer to an adhesive which may be intended to permanently bond together two objects. A permanent adhesive is not necessarily provided with a capability to be easily destroyed by thermal, chemical or mechanical means. A permanent adhesive may also provide a higher adhesive force compared to a temporary adhesive.

A carrier in accordance with the disclosure may correspond to a temporary carrier intended to support, for example, the reconstituted wafer during further processing steps. A carrier in accordance with the disclosure may also correspond to a carrier which may be intended to remain permanently attached to the mold compound of the reconstituted wafer.

Possible materials for a carrier may include metal, especially a base metal, glass and/or ceramic. The carrier material may be chosen to be a rigid material, and the thickness of the carrier may be sufficient to provide a desired rigidness. A carrier in accordance with the disclosure may be made of or may include any other suitable material. The material of the carrier may also be adapted with regard to its CTE (Coefficient of Thermal Expansion) to the reconstituted wafer.

FIG. 1 schematically illustrates in a cross-sectional view a bonded system 10 according to a first example. The bonded system 10 includes a carrier 12, an adhesive layer 14, a moisture barrier layer 16 and a reconstituted wafer 18. The reconstituted wafer 18 includes semiconductor chips 20 embedded in a molding compound 22. In one example, the molding compound 22 used may be epoxy-based. More generally, the molding compound may include a hygroscopic material.

A forming of the reconstituted wafer 18 may include arranging singulated chips 20 distant from each other on the bottom of a mold form or a mold tool. A molding compound may then be filled in liquid form or in powder form into the molding tool and pressed into a desired form, thereby embedding the chips 20. The molding compound may be cured, for example by heat or radiation.

The moisture barrier 16 is arranged on a surface of the reconstituted wafer 18, and more specifically it is arranged on a surface of the molding compound 22. The moisture barrier layer 16 is arranged on a surface of the reconstituted wafer 18 which is to be adhesively bonded to the carrier 12, i.e. the moisture barrier layer 16 is sandwiched between the reconstituted wafer 18 and the carrier 12. In one example, the moisture barrier 16 may be (or may include) an oxide layer. In a further example, the moisture barrier layer 16 may be (or may include) a nitride layer. In yet a further example, the moisture barrier layer 16 may be (or may include) a carbide layer. The moisture barrier layer 16 may also include an arbitrary combination of the mentioned layers. The moisture barrier layer 16 may have a thickness $d_1$ of about 200 nm to about 3000 nm. The moisture barrier layer 16 may have a thickness which is sufficient to prevent moisture to penetrate the moisture barrier layer 16. The moisture barrier layer 16 may have a thickness which is sufficient to substantially retard penetration of moisture. The moisture barrier layer 16 may also completely prohibit penetration of moisture. The moisture barrier layer thickness $d_1$ may depend on a surface roughness of the mold compound 22.

The moisture barrier layer 16 may be (or may include) a metal layer. The metal layer may have a thickness of about 20 nm to about 1000 nm, in particular a thickness of about 100 nm. The moisture barrier layer 16 may be thicker (regardless of the used material) if the surface of the reconstituted wafer 18 is rougher. The moisture barrier layer 16 is arranged on the reconstituted wafer 18 in a way that it sticks or adheres permanently to the mold compound 22. An oxide layer, a nitride layer or a carbide layer may be deposited on the reconstituted wafer 18 by Chemical Vapor Deposition (CVD). A metal barrier may be deposited on the reconstituted wafer 18 by a sputtering process. Other deposition processes are possible that are configured to deposit the moisture barrier layer 16 securely onto the molding compound 22. The hygroscopic material or in other words the molding compound 22 may be dried prior to depositing the moisture barrier layer 16. The hygroscopic material may be dried in a nitrogen atmosphere.

The adhesive layer 14 is arranged on a surface of the moisture barrier 16 which is opposite to the reconstituted wafer 18. The adhesive layer 14 may include a temporary or a permanent adhesive. The adhesive layer 14 is sandwiched between the moisture barrier 16 and the carrier 12. The moisture barrier 16 is sandwiched between the reconstituted wafer 18 and the adhesive layer 14.

The carrier 12 is arranged on a surface of the adhesive layer 14 opposite the moisture barrier 16 and thus opposite the reconstituted wafer 18. The adhesive layer 14 bonds the reconstituted wafer 18 and the carrier 12 together. The adhesively bonding of the carrier 12 to the reconstituted wafer 18 may necessitate a curing step.

The mold compound 22 may be or may include a hygroscopic material. The reconstituted wafer 18 may absorb water or humidity from the surrounding atmosphere and release water or humidity or moisture when the temperature rises or during a vacuum process. This moisture can come out of the reconstituted wafer 18 on all surfaces. However, the moisture barrier 16 may hinder or prohibit penetration of moisture. Therefore, humidity may come out at surfaces not covered by the moisture barrier layer 16. Humidity does not necessarily come out or is not necessarily released at the bonding surface. Therefore, no delamination of the adhesive layer 14 occurs due to moisture. It is to be understood that the moisture barrier layer 16, according to the example shown in FIG. 1, does not prevent humidity to enter the reconstituted wafer 18. The moisture barrier layer 16 is arranged to prevent only moisture outcome at the bonding surface.

Figure 2:
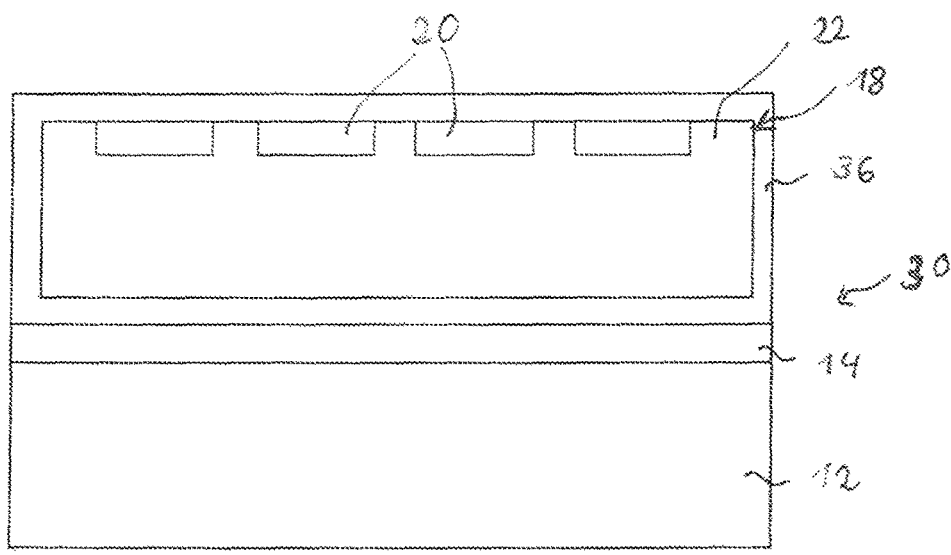
FIG. 2 schematically illustrates a second example of a bonded system.

FIG. 2 schematically illustrates in a cross-sectional view a bonded system 30 according to a second example. The bonded system 30 includes a carrier 12, an adhesive layer 14 and a reconstituted wafer 18. The reconstituted wafer 18 includes a mold compound 22 and semiconductor chips 20. The same reference signs used in FIG. 1 are used in FIG. 2 for same or equivalent parts. This indicates that in the bonded system 30 the same kind of carrier 12 may be used as for bonded system 10, the same kind of adhesive layer 14 and the same kind of reconstituted wafer 18. The bonded system 30 may differ from bonded system 10 in the moisture barrier layer 36. In contrast to the moisture barrier layer 16 of FIG. 1, the moisture barrier layer 36 of FIG. 2 completely encloses the reconstituted wafer 18. That is, the moisture barrier layer 36 covers a lower surface, an upper surface and side surfaces of the reconstituted wafer 18. The moisture barrier layer 36 does not only adhere to the mold compound 22, but also to upper surfaces of the semiconductor chips 20.

The moisture barrier layer 36 may include or may be formed of the same materials as the moisture barrier layer 16. The moisture barrier layer 36 may be (or may include at least one of) an oxide layer, a nitride layer, a carbide layer, a metal layer. The thicknesses mentioned with reference to FIG. 1 may also apply for the thickness of the moisture barrier layer 36 of FIG. 2.

Since the moisture barrier layer 36 completely encloses the reconstituted wafer 18, the hygroscopic material 22 cannot necessarily absorb any further humidity. Humidity already absorbed by the hygroscopic material cannot be given off. Therefore, the reconstituted wafer 18 is dried before depositing the moisture barrier layer 36.

Figure 3:
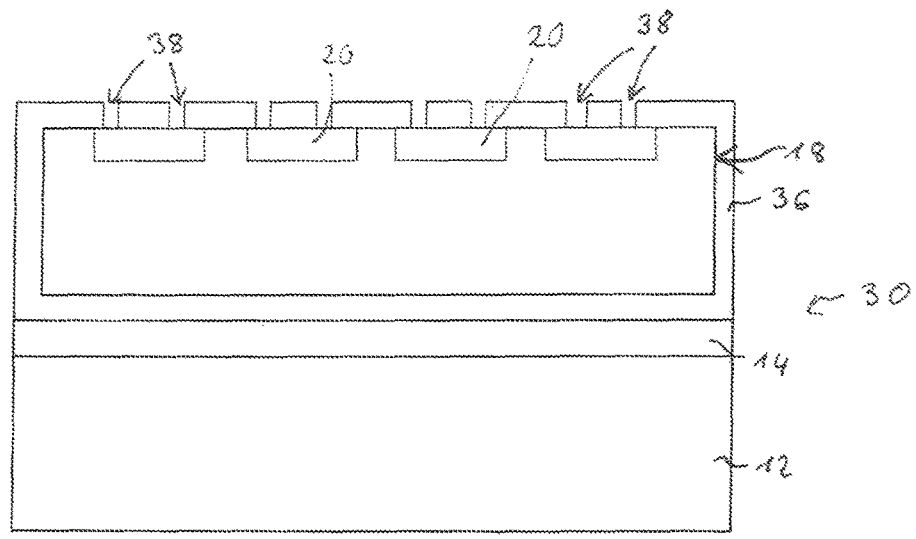
FIG. 3 schematically illustrates the bonded system of FIG. 2 with exposed contact areas of semiconductor chips.

FIG. 3 illustrates the bonded system of FIG. 2 after openings 38 are provided into the moisture barrier layer 36. The openings 38 expose contact areas on the semiconductor chips 20 which are not shown in FIG. 3. The openings 38 allow contacting the contact areas of the semiconductor chip 20 which are otherwise covered by the moisture barrier layer 36. For example, the openings 38 may be effectuated by masking, etching and/or lithographic steps.

Figure 4:
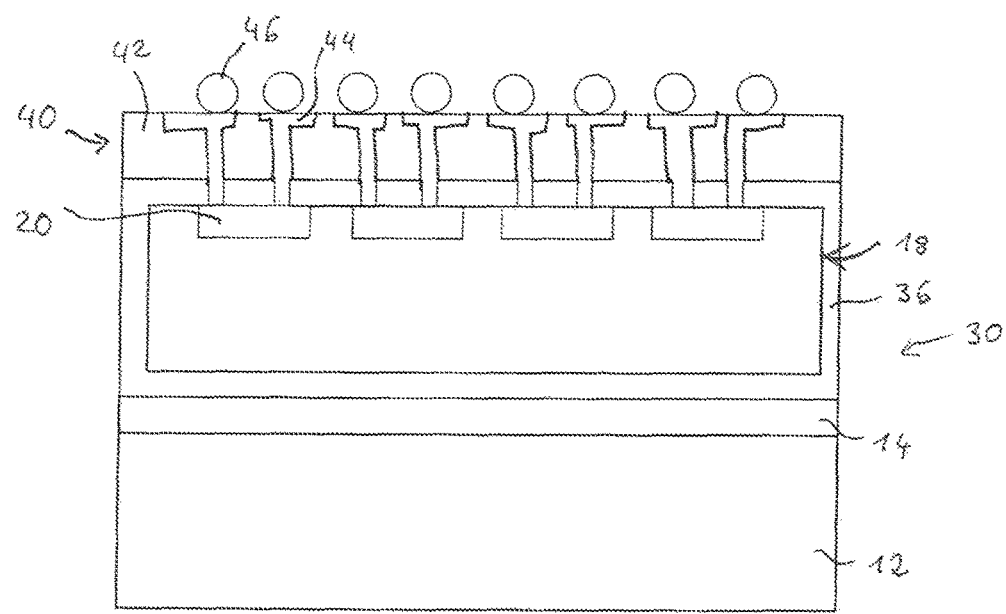
FIG. 4 schematically illustrates the bonded system of FIG. 3 with an added redistribution layer.

FIG. 4 illustrates the bonded system 30 with a redistribution layer 40 applied on top of the reconstituted wafer 18. The redistribution layer 40 may include an isolation material 42 and electrically conducting regions 44 as well as solder balls 46. The conducting regions 44 may establish an electrical contact between the contact areas of the semiconductor chips 20 and the respective solder balls 46. It is understood that a similar redistribution layer may also be arranged on top of the bonded system 10 as illustrated in FIG. 1. In contrast to the example of FIG. 4, the example of FIG. 1 does not necessitate a step of opening the moisture barrier layer 16, because the moisture barrier layer 16 is not arranged on top of the semiconductor chips 20 so that contact areas of the semiconductor chips 20 are already exposed.

Figure 5A:
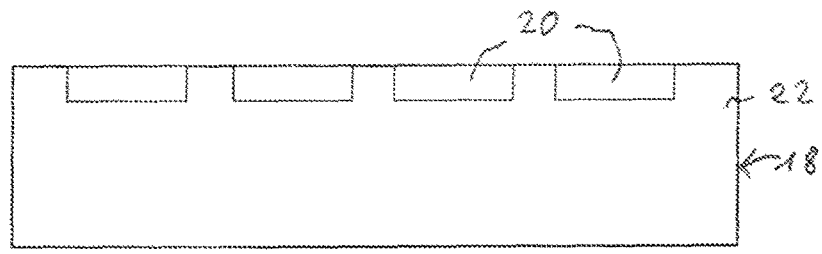
FIGS. 5A to 5D schematically illustrate a method for bonding a reconstituted wafer to a carrier.

A method in accordance with the disclosure is described in connection with FIGS. 5A to 5D. FIG. 5A shows a reconstituted wafer 18 including semiconductor chips 20 embedded in a mold compound 22. The reconstituted wafer 18 may necessitate a carrier for handling during further processing steps. The mold compound 22 may be or may include a hygroscopic material. The reconstituted wafer 18 may be dried to remove any moisture absorbed by the hygroscopic material. The reconstituted wafer 18 may be dried in a nitrogen atmosphere furnace. Specific drying temperatures and drying time periods may depend on the used mold compound material. Exemplary, a drying temperature may be about 120° C. Exemplary, a drying time period may be about 6 hours. It is to be understood, that other temperatures and other time periods may be used.

Figure 5B:
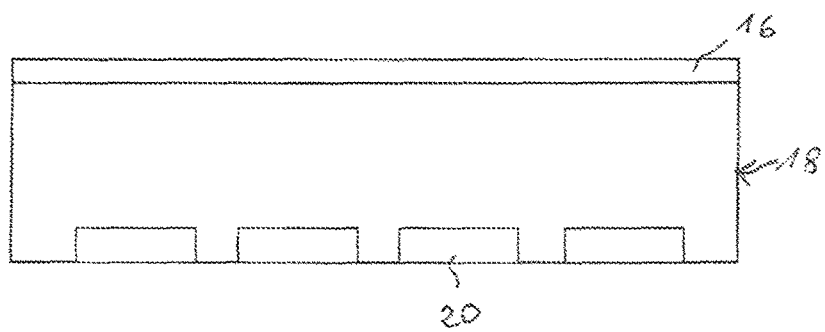

FIG. 5B illustrates the reconstituted wafer 18 of FIG. 5A turned upside down. A moisture barrier layer 16 is applied to a surface of the reconstituted wafer 18. More specifically, the moisture barrier layer 16 is deposited on a surface of the reconstituted wafer 18 opposite the embedded semiconductor chips 20. The moisture barrier layer 16 may be deposited using a chemical vapor deposition process. It is understood that the moisture barrier layer 16 may also cover side surfaces of the reconstituted wafer 18 (not shown in FIG. 5B). According to the first example, the moisture barrier layer 16 does not cover the surface of the reconstituted wafer 18 at which the semiconductor chips 20 are arranged. The moisture barrier layer 16 may be an oxide layer, a nitride layer or a carbide layer deposited by CVD.

The moisture barrier layer 16 may also be deposited by sputtering. A metal layer 16 may be sputtered onto a surface of the reconstituted wafer 18 opposite the semiconductor chips 20. A metal layer may also cover side surfaces of the reconstituted wafer 18. For the moisture barrier layer 16, the same thicknesses as discussed above may apply.

Figure 5C:
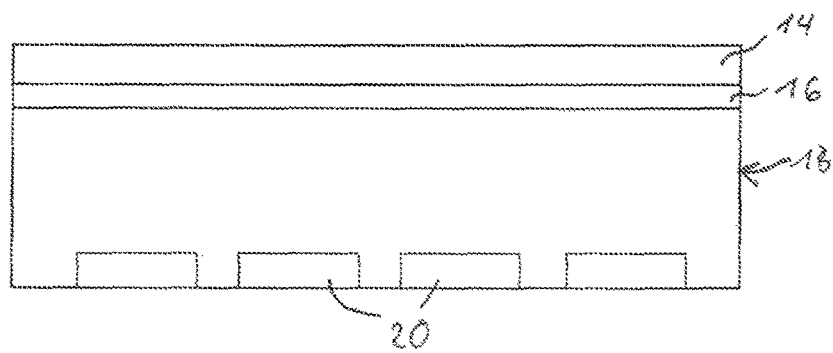

FIG. 5C illustrates the reconstituted wafer 18 of FIG. 5B after an adhesive layer 14 has been applied. The adhesive layer 14 is applied on the surface of the moisture barrier layer 16 opposite the reconstituted wafer 18. The adhesive layer 14 is chosen to provide a desired adhesive force between the moisture barrier layer 16 and a carrier. The adhesive may be a permanent or a temporary adhesive.

Figure 5D:
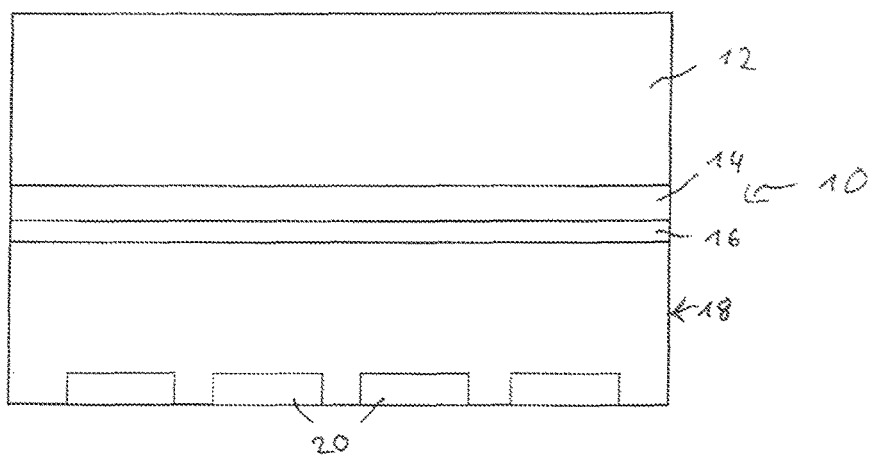

FIG. 5D illustrates the bonded system 10 which is obtained after the carrier 12 has been arranged on a surface of the adhesive layer 14 opposite the moisture barrier layer 16. It is understood that it may also be possible to apply the adhesive layer 14 to the carrier 12 first, and then arrange the adhesive layer 14 with the carrier 12 on the moisture barrier layer 16. Depending on the used adhesive in the adhesive layer 14 a curing step may be effectuated. The curing step may necessitate e.g., heating or subjecting the layer to radiation. The carrier 12 may thus be adhesively bonded to the reconstituted wafer 18. It is understood that a method for producing the bonded system 30 may be similar to the described method for producing the bonded system 10 with the difference that instead of the moisture barrier layer 16 the moisture barrier layer 36 is applied completely enclosing the reconstituted wafer 18.

Figure 6A:
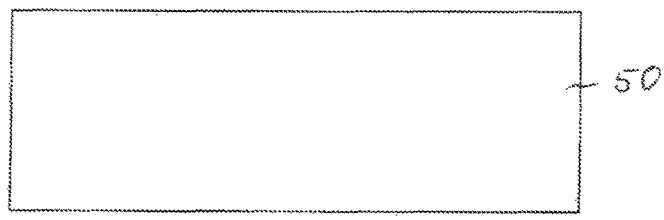
FIGS. 6A to 6C schematically illustrate a method for adhesively bonding a hygroscopic material to a substrate.
Figure 6B:
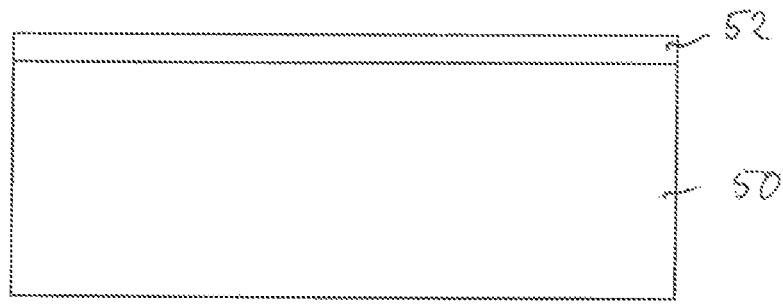
Figure 6C:
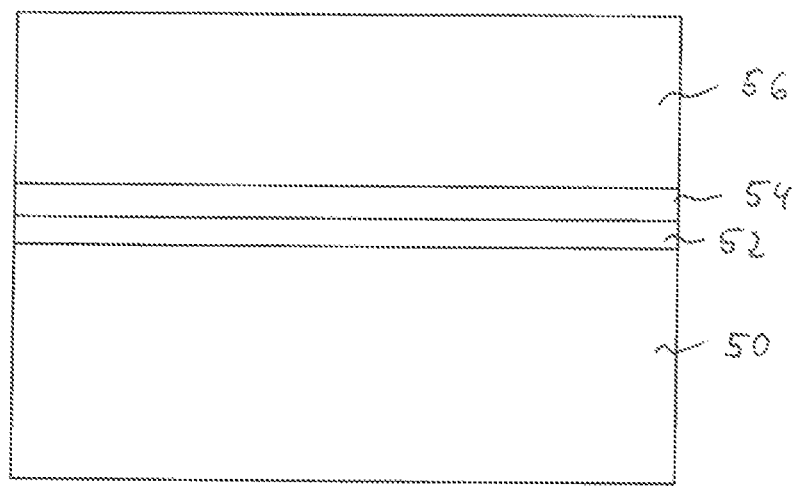

FIGS. 6A to 6C illustrate more a method for adhesively bonding a hygroscopic material to a substrate. FIG. 6A schematically illustrates a hygroscopic material 50 as a solid block. The solid block of hygroscopic material 50 may be of arbitrary form or shape. It is noted that the solid block it not limited to correspond to a reconstituted wafer. The solid block of hygroscopic material is to be bonded to a substrate. Preferably, the hygroscopic material 50 is provided in a dried form. That is, the hygroscopic material 50 does not necessarily contain any moisture or may contain only very little moisture.

FIG. 6B schematically illustrates the block of hygroscopic material 50 and a moisture barrier layer 52 applied thereto. It is understood that, although FIGS. 6A to 6C schematically illustrate the moisture barrier layer 52 and the hygroscopic material 50 as rectangles, the hygroscopic material 50 may be of any form and the moisture barrier layer 52 covers the surface to be bonded. Thus, moisture barrier layer may have any form as well. The moisture barrier layer 52 may include any material suitable to prevent moisture to penetrate as discussed before. The moisture barrier layer 52 may be deposited by any suitable process such as e.g., sputtering or CVD.

FIG. 6C schematically illustrates the hygroscopic material 50 with the applied moisture barrier 52 adhesively bonded by an adhesive layer 54 to a substrate 56. It is understood that the substrate 56 may be any solid material to which the hygroscopic material is to be bonded. The adhesive layer 54 is arranged on the moisture barrier layer 52 and more specifically, on a surface of the moisture barrier layer 52 opposite to the hygroscopic material 50. The adhesive of the adhesive layer 54 is adapted to the substrate 56 and to the material used for the moisture barrier 52 to provide a desired adhesive strength. By providing a moisture barrier layer 52 between the hygroscopic material 50 and the adhesive layer 54, adhesively bonding may be enhanced and the quality of the bond between the hygroscopic material 50 and the substrate 56 may be improved. The hygroscopic material 50 may still absorb moisture. Penetration of humidity into the hygroscopic material 50 may not necessarily be hindered. The moisture barrier 52 rather protects the bonding interface. No humidity comes out at this interface such that no delamination of the adhesive layer occurs.

Figure 7:
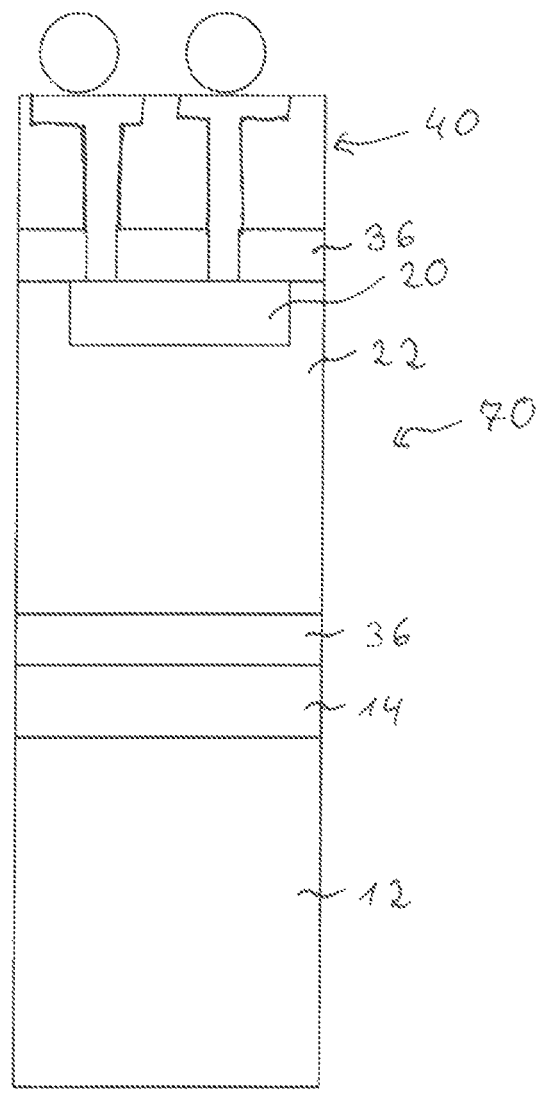
FIG. 7 schematically illustrates an electronic component including a carrier obtained in accordance with the disclosure.

FIG. 7 illustrates an electronic component 70 which may be obtained by cutting the bonded system 30 of FIG. 4 along vertical lines. In the example of FIG. 7, the carrier 12 is a permanent carrier forming part of the electronic component 70. The semiconductor chip 20 is embedded in the hygroscopic material 22. The semiconductor chip 20 has a first surface which is coplanar to a first surface of the hygroscopic material 22. The moisture barrier layer 36 is arranged on a second surface of the hygroscopic material 22 opposite to the first surface. The adhesive bond between the carrier 12 and the hygroscopic material 22 remains protected even after separating the reconstituted wafer into electronic components.

FIG. 7 illustrates an electronic component obtained by separating a bonded system which is enclosed in the moisture barrier layer 36. Therefore, the moisture barrier layer 36 also lies between the semiconductor chip 20 and an upper surface, or first surface of the hygroscopic material 22 and the redistribution layer 40. It is understood that, after a separation into electronic components, moisture may again penetrate the hygroscopic material 22, because no protection is provided at side surfaces.

A further electronic component may not include a moisture barrier layer 36 on the first surface of the hygroscopic material 22, i.e. on the side of the semiconductor chips, but rather a moisture barrier layer 16 only on the second surface of the hygroscopic material 22 according to the first example discussed with reference to FIG. 1. The moisture barrier layer 16 or 36 may again be one out of an oxide layer, a nitride layer, a carbide layer, a metal layer.

Figure 8:
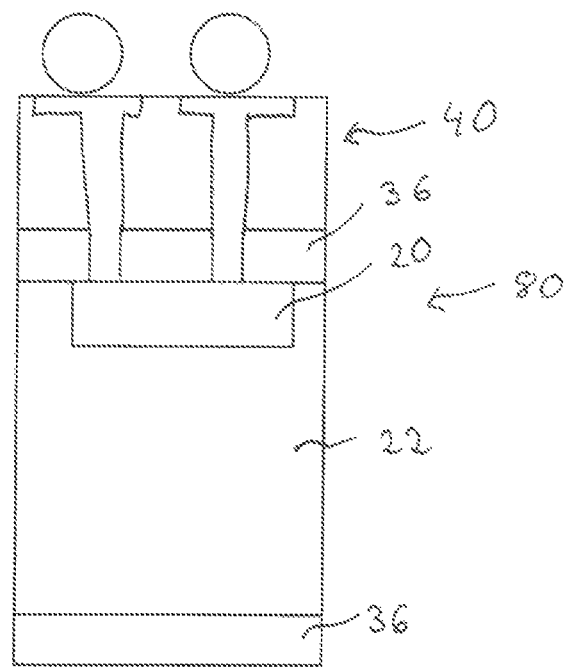
FIG. 8 schematically illustrates an electronic component including a moisture barrier layer obtained in accordance with the disclosure.

FIG. 8 schematically illustrates an electronic component 80 which may be obtained by cutting the bonded system 30 of FIG. 4 along vertical lines after the carrier 12 and the adhesive layer 14 have been removed. According to the example illustrated in FIG. 8, the carrier 12 is a temporary carrier used only during processing of the reconstituted wafer. The moisture barrier layer 36 of FIG. 8 or moisture barrier layer 16 (not shown) may remain on the hygroscopic material 22. The moisture barrier layer 16, 36 may provide a protection to the electronic component. The moisture barrier layer 16, 36 may enhance the possibility for adhesively bonding the electronic component 80 to a support. The moisture barrier layer 16, 36 may enhance stability of the electronic component 80. The moisture barrier layer 16, 36 may provide a shielding function.

In another example, the moisture barrier layer 16, 36 at the second surface of the hygroscopic material 22 may be removed together with the carrier 12 and the adhesive layer 14. For example, the removal may be effectuated by an abrasive process and/or by etching.

Although specific examples have been illustrated and described herein, it will be appreciated by those of ordinary skill in the art that a variety of alternate and/or equivalent implementations may be substituted for the specific examples shown and described without departing from the concept of the present invention. This application is intended to cover any adaptations or variations of the specific examples discussed herein. Therefore, it is intended that this invention will be limited only by the claims and the equivalence thereof.

What is claimed is:

1. A bonded system, comprising:
   a reconstituted wafer comprising a hygroscopic material, the hygroscopic material forming entirely a first major surface of the reconstituted wafer;
   a moisture barrier arranged over the first surface of the reconstituted wafer, wherein the moisture barrier has a thickness of 20 nm to 3000 nm;
   an adhesive layer arranged over a surface of the moisture barrier opposite the reconstituted wafer so that the moisture barrier is arranged between the first major surface of the reconstituted wafer and the adhesive layer; and
   a carrier arranged over a surface of the adhesive layer opposite the moisture barrier, wherein the adhesive layer adhesively bonds the first major surface of the reconstituted wafer and the carrier together.

2. The bonded system of claim 1, wherein the hygroscopic material comprises a mold compound.

3. The bonded system of claim 1, wherein the moisture barrier comprises at least one of an oxide layer, a nitride layer, a carbide layer or a metal layer.

4. The bonded system of claim 3, wherein the thickness of the moisture barrier is 200 nm to 3000 nm.

5. The bonded system of claim 3, wherein the thickness of the moisture barrier is 20 nm to 1000 nm.

6. The bonded system of claim 1, wherein the moisture barrier is disposed on all surfaces of the reconstituted wafer.

7. The bonded system of claim 6, wherein the moisture barrier is partially opened to allow a contacting of semiconductor chips comprised in the reconstituted wafer.

8. A bonded system comprising:
   a reconstituted wafer having an upper major surface and an opposing lower major surface, the reconstituted wafer including a plurality of semiconductor chips embedded within a hygroscopic material, a surface of each of the plurality of semiconductor chips coplanar with a surface of the hygroscopic material and together forming the upper major surface, and the hygroscopic material forming the entire lower major surface;
   a moisture barrier layer disposed at least on the lower major surface, wherein the moisture barrier has a thickness of 20 nm to 3000 nm; and
   an adhesive layer disposed on a surface of the moisture barrier such that the moisture barrier layer is arranged between the lower major surface of the reconstituted wafer and the adhesive layer.

9. The bonded system of claim 8, wherein the moisture barrier layer comprises at least one of an oxide layer, a nitride layer, a carbide layer or a metal layer.

10. The bonded system of claim 8, wherein a thickness of the moisture barrier layer is dependent on a roughness of the lower major surface.

11. The bonded system of claim 8, wherein the moisture barrier layer is disposed on the upper major surface and side surfaces of the reconstituted wafer.

12. The bonded system of claim 11, wherein the surface of each of the semiconductor chips at the upper major surface includes at least one contact area, the moisture barrier layer disposed on the upper major surface including openings extending through the moisture barrier layer to the at least one contact area of each semiconductor chip.

13. The bonded system of claim 12, the bonded system further including:
 a redistribution layer disposed on the moisture barrier layer disposed on the upper major surface of the reconstituted wafer.

14. A bonded system comprising:
 a reconstituted wafer having an upper major surface, a lower major surface, and a plurality of side surfaces extending between the upper and lower major surfaces, the reconstituted wafer including a plurality of semiconductor chips embedded within a hygroscopic material, a surface of each of the plurality of semiconductor chips coplanar with a surface of the hygroscopic material together forming the upper major surface, and surfaces of the hygroscopic material forming the lower major surface and side surfaces;
 a moisture barrier layer disposed on the lower major surface, the upper major surface, and each side surface of the plurality of side surfaces, wherein the surface of each of the semiconductor chips at the upper major surface includes at least one contact area, the moisture barrier layer disposed on the upper major surface including openings extending through the moisture barrier layer to the at least one contact area of each semiconductor chip;
 an adhesive layer bonding the moisture barrier to a carrier; and
 a redistribution layer disposed on the moisture barrier layer disposed on the upper major surface of the reconstituted wafer, the redistribution layer including:
  an isolation layer disposed on the moisture barrier layer disposed on the upper major surface of the reconstituted wafer, the isolation layer including openings extending through which are aligned with the opening through the moisture barrier layer; and
  a plurality of electrically regions, each electrically conductive regions filling a different one of openings through the isolation layer and through the moisture barrier and establishing electrical contact with a corresponding contact are on the semiconductor chips.

15. The bonded system of claim 14, wherein a portion of each of the electrically conductive regions is flush with a major surface of the isolation layer opposite the moisture barrier disposed on the upper major surface of the reconstituted wafer, the redistribution layer including a solder ball disposed on the flush portion of each of the electrically conductive regions.

16. A bonded system comprising:
 a reconstituted wafer comprising a hygroscopic material and having an upper major surface, a lower major surface, and a plurality of side surfaces extending between the upper and lower major surfaces, at least the lower major surface formed entirely by the hygroscopic material;
 a moisture barrier layer disposed at least on the lower major surface, wherein the moisture barrier has a thickness of 20 nm to 3000 nm;
 a carrier; and
 an adhesive layer disposed between the moisture barrier layer and the carrier and bonding the lower major surface of the reconstituted wafer to the carrier via the moisture barrier layer, with the moisture barrier layer being disposed between the adhesive layer and the reconstituted wafer.

17. The bonded system of claim 16, wherein the moisture barrier layer comprises at least one of an oxide layer, a nitride layer, a carbide layer or a metal layer.

18. The bonded system of claim 17, wherein the moisture barrier layer has a thickness based on a surface roughness of the hygroscopic material of the reconstituted wafer.

* * * * *